(12) United States Patent
Bentley et al.

(10) Patent No.: US 9,530,864 B2
(45) Date of Patent: Dec. 27, 2016

(54) JUNCTION OVERLAP CONTROL IN A SEMICONDUCTOR DEVICE USING A SACRIFICIAL SPACER LAYER

(71) Applicants: GLOBALFOUNDRIES Inc., Grand Cayman (KY); International Business Machines Corporation, Armonk, NY (US)

(72) Inventors: Steven J. Bentley, Watervliet, NY (US); Michael J. Hargrove, Clinton Corners, NY (US); Chia-Yu Chen, Yorktown Heights, NY (US); Ryan O. Jung, Rensselaer, NY (US); Sivanandha K. Kanakasabapathy, Niskayuna, NY (US); Tenko Yamashita, Schenectady, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 213 days.

(21) Appl. No.: 14/314,404

(22) Filed: Jun. 25, 2014

(65) Prior Publication Data

US 2015/0380514 A1 Dec. 31, 2015

(51) Int. Cl.
*H01L 29/66* (2006.01)
*H01L 29/78* (2006.01)

(52) U.S. Cl.
CPC ....... *H01L 29/6656* (2013.01); *H01L 29/6653* (2013.01); *H01L 29/66545* (2013.01); *H01L 29/66628* (2013.01); *H01L 29/66795* (2013.01); *H01L 29/7834* (2013.01); *H01L 29/7836* (2013.01); *H01L 29/66636* (2013.01)

(58) Field of Classification Search
CPC ...... H01L 29/66; H01L 29/78; H01L 29/6656; H01L 29/66545; H01L 29/66492; H01L 29/66795; H01L 29/7836; H01L 29/785; H01L 29/772; H01L 29/6659
USPC .......................................... 438/305, 303, 283
See application file for complete search history.

(56) References Cited

U.S. PATENT DOCUMENTS

| 6,054,355 A * | 4/2000 | Inumiya ............ H01L 21/28114 257/E21.205 |
| 6,515,338 B1 * | 2/2003 | Inumiya ............ H01L 21/28114 257/368 |
| 7,790,559 B2 * | 9/2010 | Adkisson ............ H01L 29/1037 257/411 |

(Continued)

*Primary Examiner* — Chuong A Luu
(74) *Attorney, Agent, or Firm* — Williams Morgan, P.C.

(57) ABSTRACT

Approaches for providing junction overlap control in a semiconductor device are provided. Specifically, at least one approach includes: providing a gate over a substrate; forming a set of junction extensions in a channel region adjacent the gate; forming a set of spacer layers along each of a set of sidewalls of the gate; removing the gate between the set of spacer layers to form an opening; removing, from within the opening, an exposed sacrificial spacer layer of the set of spacer layers, the exposed sacrificial spacer layer defining a junction extension overlap linear distance from the set of sidewalls of the gate; and forming a replacement gate electrode within the opening. This results in a highly scaled advanced transistor having precisely defined junction profiles and well-controlled gate overlap geometry achieved using extremely abrupt junctions whose surface position is defined using the set of spacer layers.

20 Claims, 11 Drawing Sheets

(56) References Cited

U.S. PATENT DOCUMENTS

| | | | |
|---|---|---|---|
| 2001/0023120 A1* | 9/2001 | Tsunashima | H01L 21/28088 438/585 |
| 2004/0046192 A1* | 3/2004 | Lenoble | H01L 21/2652 257/288 |
| 2007/0287259 A1 | 12/2007 | Kavalieros et al. | |
| 2010/0314697 A1* | 12/2010 | Adkisson | H01L 29/1037 257/411 |
| 2011/0042758 A1* | 2/2011 | Kikuchi | H01L 29/1054 257/408 |
| 2013/0187229 A1 | 7/2013 | Cheng et al. | |
| 2015/0364595 A1* | 12/2015 | Liu | H01L 29/66795 257/401 |

\* cited by examiner

JUNCTION OVERLAP CONTROL IN A SEMICONDUCTOR DEVICE USING A SACRIFICIAL SPACER LAYER

BACKGROUND

Technical Field

This invention relates generally to the field of semiconductors, and more particularly, to forming a semiconductor device having a set of spacer layers for controlled junction overlap.

Related Art

Recently, the performance of semiconductor devices, such as Metal Oxide Semiconductor Field-Effect Transistors (MOS-FETs), has been greatly enhanced by the incorporation of shallow junctions into the active portions of a semiconductor substrate, e.g. the use of shallow tip extensions. The presence of such shallow junctions may greatly enhance the rate at which charge migrates in a channel when a semiconductor is in an ON state.

For advanced, non-diffusive junctions, it is desirable to control junction overlap to create well-defined profiles. One way to do this is to create extremely abrupt junctions whose surface position is defined using a sacrificial spacer. However, defining these sacrificial spacers is difficult, as achieving etch selectivity using a sacrificial material is complex. One current approach employs diffused species to achieve gate overlap. However, as the device is scaled, abrupt and shallow junctions are required, and such lateral diffusion will not yield a controllable transistor off-state. This method is hence not adequately scalable.

Furthermore, these highly scaled advanced transistors require precisely defined junction profiles and well-controlled gate overlap geometry to achieve well-behaved short-channel characteristics. However, positioning the junction correctly with respect to the gate is challenging with current art approaches.

SUMMARY

In general, approaches for providing junction overlap control in a semiconductor device are provided. Specifically, at least one approach includes: providing a gate over a substrate; forming a set of junction extensions in a channel region adjacent the gate; forming a set of spacer layers along each of a set of sidewalls of the gate; removing the gate between the set of spacer layers to form an opening; removing, from within the opening, an exposed sacrificial spacer layer of the set of spacer layers, the exposed sacrificial spacer layer defining a junction extension overlap distance from the set of sidewalls of the gate; and forming a replacement gate electrode within the opening. In one approach, the set of junction extensions is formed by first providing a dummy layer over the substrate, followed by a doping and drive-in process through the dummy layer. In other approaches, the dummy layer may be removed prior to doping. Spacers are then formed by oxidizing the gate to grow the dummy oxide only on the set of sidewalls of the gate. In another approach, the set of spacer layers is formed by: forming a bilayer spacer along the sidewalls of the gate, wherein a sacrificial layer of the bilayer spacer can be selectively etched to a next, lower layer of bilayer spacer; and forming a set of conformal spacer layers adjacent to the set of bilayer spacers. In both approaches, a highly scaled advanced transistor having precisely defined junction profiles and well-controlled gate overlap geometry is achieved using extremely abrupt junctions whose surface position is defined using the set of spacer layers.

One aspect of the present invention includes a method for providing junction overlap control in a semiconductor device, the method comprising: providing a gate over a substrate; forming a set of junction extensions adjacent the gate; forming a set of spacer layers along each of a set of sidewalls of the gate; removing the gate between the set of spacer layers to form an opening; removing, from within the opening, an exposed sacrificial spacer layer of the set of spacer layers, the exposed sacrificial spacer layer defining a junction extension overlap distance; and forming a replacement gate electrode within the opening.

Another aspect of the present invention includes a method for providing junction overlap control in a fin field effect transistor (FinFET) device, the method comprising: providing a gate over a substrate; forming a set of junction extensions adjacent the gate; forming a set of spacer layers along each of a set of sidewalls of the gate; removing the gate between the set of spacer layers to form an opening; removing, from within the opening, an exposed sacrificial spacer layer of the set of spacer layers, the exposed sacrificial spacer layer defining a junction extension overlap linear distance from the set of sidewalls of the gate; and forming a replacement gate electrode within the opening.

Yet another aspect of the present invention includes a semiconductor device, comprising: a set of junction extensions adjacent a replacement gate; and a set of spacer layers formed along each of a set of sidewalls of the replacement gate, wherein the replacement gate includes a replacement gate electrode formed within an opening between the set of spacer layers, the replacement gate electrode extending over the set of junction extensions by a junction extension overlap linear distance defined by a sacrificial spacer layer of the set of spacer layers that is removed from the opening prior to formation of the replacement gate material.

BRIEF DESCRIPTION OF THE DRAWINGS

These and other features of this invention will be more readily understood from the following detailed description of the various aspects of the invention taken in conjunction with the accompanying drawings in which.

Figure 1A:
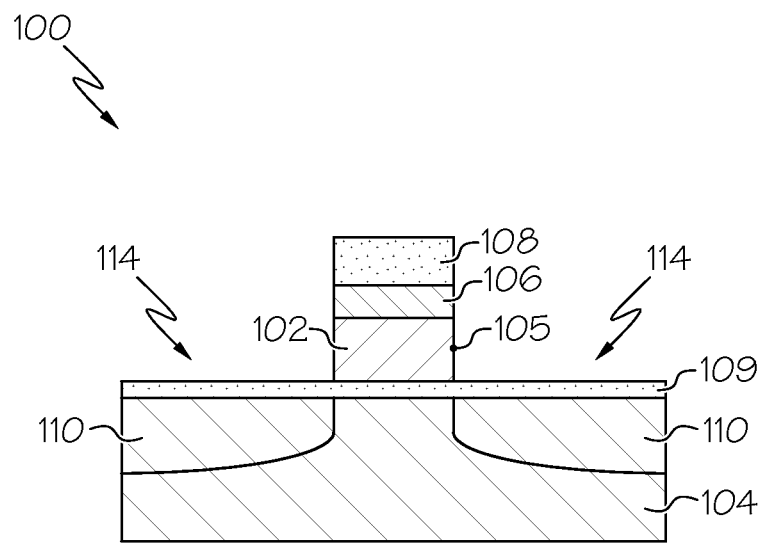
FIG. 1(A) shows a cross-sectional view of a semiconductor device following formation of a dummy layer adjacent a gate provided over a substrate according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As stated above, approaches for providing junction overlap control in a semiconductor device are provided. Specifically, at least one approach includes: providing a gate over a substrate; forming a set of junction extensions in a channel region adjacent the gate; forming a set of spacer layers along each of a set of sidewalls of the gate; removing the gate between the set of spacer layers to form an opening; removing, from within the opening, an exposed sacrificial spacer layer of the set of spacer layers, the exposed sacrificial spacer layer defining a junction extension overlap distance from the set of sidewalls of the gate; and forming a replacement gate electrode within the opening. In one approach, the set of junction extensions is formed by first providing a dummy layer over the substrate, followed by a doping and drive-in process through the dummy layer. In other approaches, the dummy layer may be removed prior to doping. Spacers are then formed by oxidizing the gate to grow the dummy oxide only on the set of sidewalls of the gate. In another approach, the set of spacer layers is formed by: forming a bilayer spacer along the sidewalls of the gate, wherein a sacrificial layer of the bilayer spacer can be selectively etched to a next, lower layer of bilayer spacer; and forming a set of conformal spacer layers adjacent to the set of bilayer spacers. In both approaches, a highly scaled advanced transistor having precisely defined junction profiles and well-controlled gate overlap geometry is achieved using extremely abrupt junctions whose surface position is defined using the set of spacer layers.

With reference now to the figures, FIG. 1(A) shows a semiconductor device 100 (e.g., a FinFET) including a gate 102 (e.g., a gate electrode for a replacement gate) formed over a substrate 104, gate 102 having a set of sidewalls 105, and including a capping layer 106 (e.g., silicon nitride (SiN)) and oxide 108 formed thereon. Device 100 further includes a dummy layer 109 (e.g., oxide), and a set of junction extensions 110 formed adjacent gate 102 in a channel region 114 of device 100. Although not specifically shown, device 100 also includes a set of fins patterned from substrate 104, as conventionally known.

The term "substrate" as used herein is intended to include a semiconductor substrate, a semiconductor epitaxial layer deposited or otherwise formed on a semiconductor substrate, and/or any other suitable type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion of or the entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

Figure 1B:
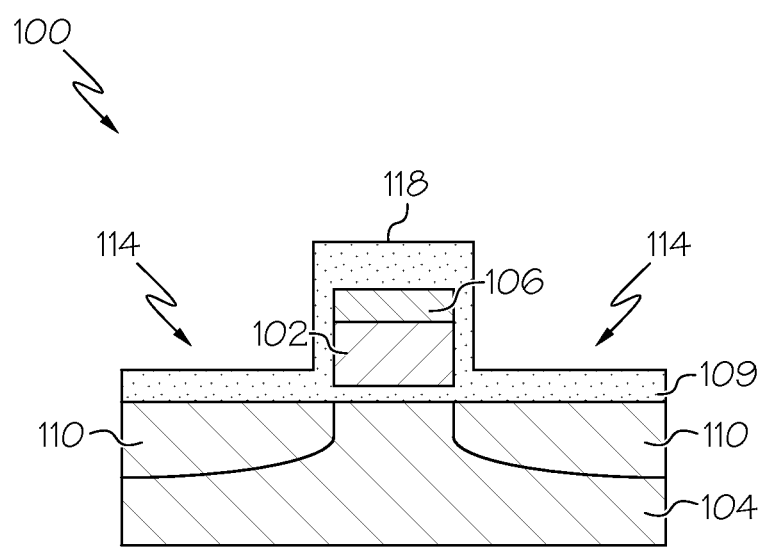
FIG. 1(B) shows a cross-sectional view of the semiconductor device following formation of a spacer oxide according to illustrative embodiments.
Figure 1C:
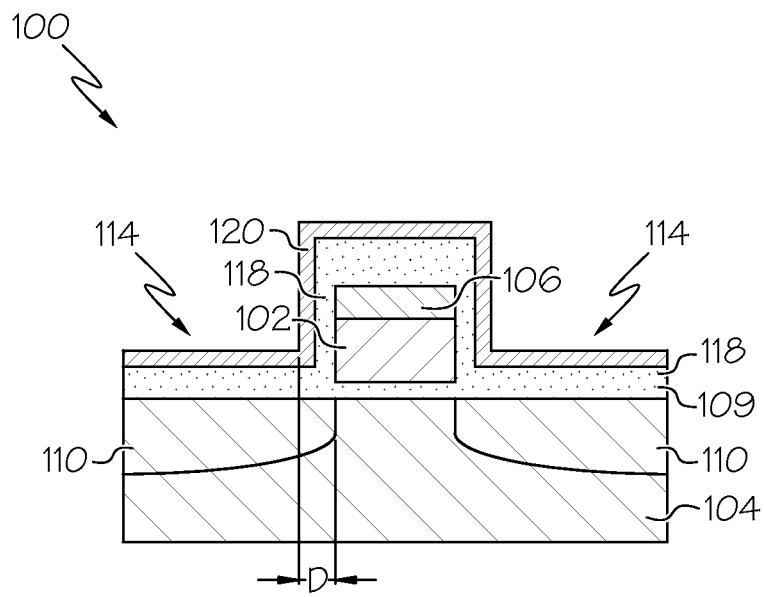
FIG. 1(C) shows a cross-sectional view of the device following formation of a low-k spacer layer according to illustrative embodiments.

Next, as shown by device 100 in FIGS. 1(B)-1(C), a set of bilayer spacers is formed along sidewalls 105 of gate 102. In an exemplary embodiment, a sacrificial spacer oxide 118 is first formed over gate 102 and channel region 114, as shown in FIG. 1(B), wherein spacer oxide 118 is a thin (e.g., 10-20Å) layer of oxide formed via atomic layer deposition (ALD) or in-situ radical assisted deposition (iRAD). A low k-spacer layer 120 is then formed over device 100, as shown in FIG. 1(C). In an exemplary embodiment, low-k spacer layer 120 comprises a thin (e.g., 10-20Å) layer of silicon boron carbon nitride (SiBCN) or SiN, wherein a total thickness of sacrificial spacer oxide 118 and sacrificial SiBCN provides a final junction extension overlap distance/thickness 'D', as will be described in further detail below. As used herein, low-k spacer layer 120 refers to a material having a low dielectric constant (i.e., <3.9).

Figure 1D:
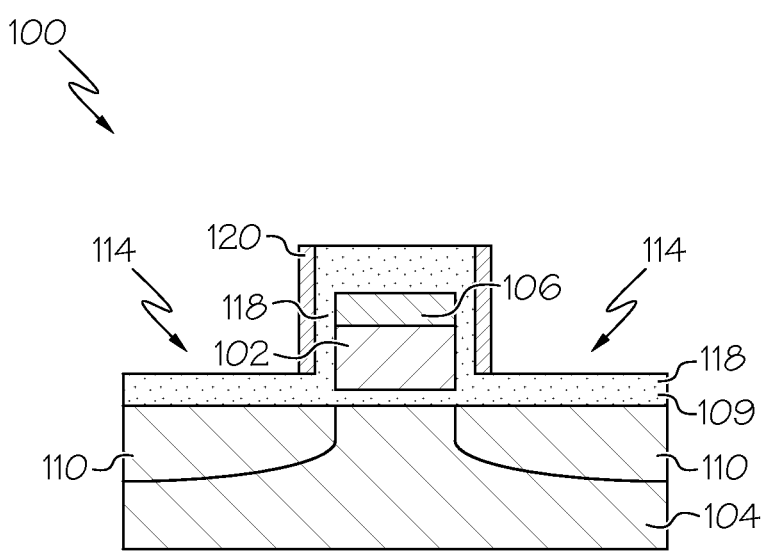
FIG. 1(D) shows a cross-sectional view of the device following removal of the low-k spacer layer from atop a channel region, leaving oxide on the channel surface according to illustrative embodiments.

Next, as shown by device 100 in FIG. 1(D), low-k spacer layer 120 is partially removed to form a set of low-k spacer layers 120 along each sidewall 105 of gate 102. In an exemplary embodiment, the SiBCN of low-k layer 120 is etched (e.g., via a reactive ion etch (RIE) process) selective to spacer oxide 118 so as to be pulled down completely from the fins (not shown) of device 100, leaving spacer oxide 118 substantially intact.

Figure 1E:
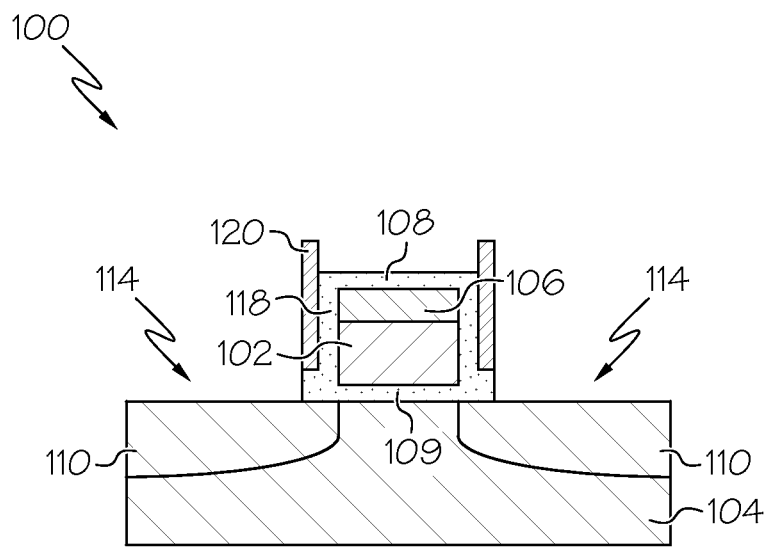
FIG. 1(E) shows a cross-sectional view of the device following removal of the spacer oxide according to illustrative embodiments.

Processing continues, as shown in FIG. 1(E), whereby spacer oxide 118 is removed isotropically from gate channel 114 and from atop gate 102. In an exemplary embodiment, a chemical oxide removal (COR) is performed to remove oxide spacer 118, as the process is benign to the material of channel region 114 and gives controlled oxide removal selective to SiBCN. This allows complete removal of oxide, including any dummy oxide, down from the fins of substrate 104. In one embodiment, the COR process includes a step of exposing the structure to a gaseous mixture of HF and ammonia, preferably in a ratio of 2:1, at a pressure between 1 mTorr and 10 mTorr and a temperature of about 25° C. During this exposure, the HF and ammonia gases react with the sidewall residue of the gate etch to form a solid reaction product. The solid reaction product is removed in a second step which includes heating the structure to a temperature about 100° C., thus causing the reaction product to evaporate. Alternatively, the reaction product may be removed by rinsing the structure in water, or removing with an aqueous solution.

Figure 1F:
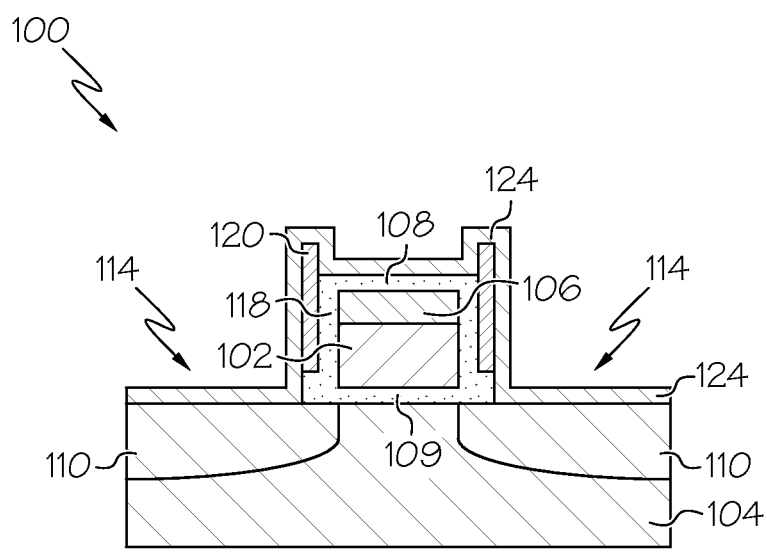
FIG. 1(F) shows a cross-sectional view of the device following deposition of a conformal spacer layer according to illustrative embodiments.
Figure 1G:
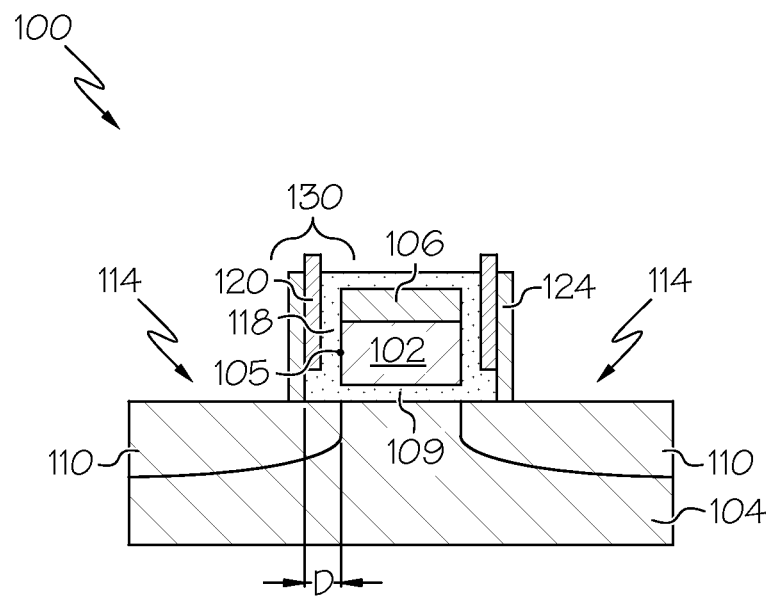
FIG. 1(G) shows a cross-sectional view of the device following partial removal of the conformal spacer layer according to illustrative embodiments.

Next, as shown in FIG. 1(F), a conformal spacer layer 124 is formed over device 100. In an exemplary embodiment, conformal spacer layer 124 comprises either SiN or low-k, and is directly formed over gate capping layer 108, low-k layers 120, and substrate 104 because selectivity to SiBCN is not needed. Conformal spacer layer 124 is then partially removed to form a set of conformal spacer layers 124 adjacent the set of low-k spacer layers 120, as shown in FIG. 1(G). Once formed, gate oxide 118, low-k layers 120, and conformal spacer layer 124 together make up a set of spacer layers 130 along sidewalls 105 of gate 102.

Figure 1H:
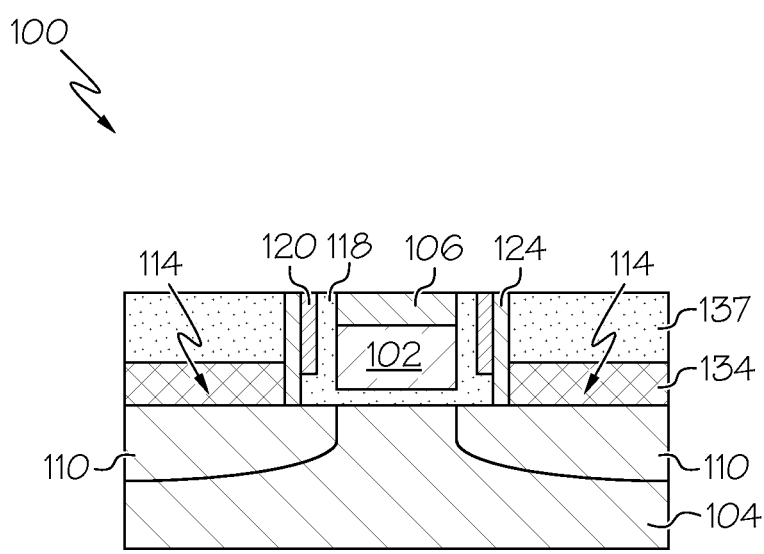
FIG. 1(H) shows a cross-sectional view of the device following formation of a heavily doped layer and interlayer oxide adjacent the gate according to illustrative embodiments.

FIG. 1(H) shows device 100 after a subsequent process step of forming highly-doped source/drain regions 134 adjacent formal spacer layer 124. In embodiments, the plurality of highly-doped source/drain regions 134 may be epitaxial source/drain regions. In embodiments, the plurality of source/drain regions 134 may include, for example, silicon, and/or silicon germanium, or a III-V material. In other embodiments, not shown, these regions may be embedded into channel 114 by first partially or fully recessing the channel, then epitaxially growing the source/drain material. Dielectric capping of the source/drain material is then performed using CVD deposition and chemical mechanical planarization (CMP) processes to form interlayer dielectric layer(s) 137, preferably planarized to the SiN of capping layer 106.

Figure 1I:
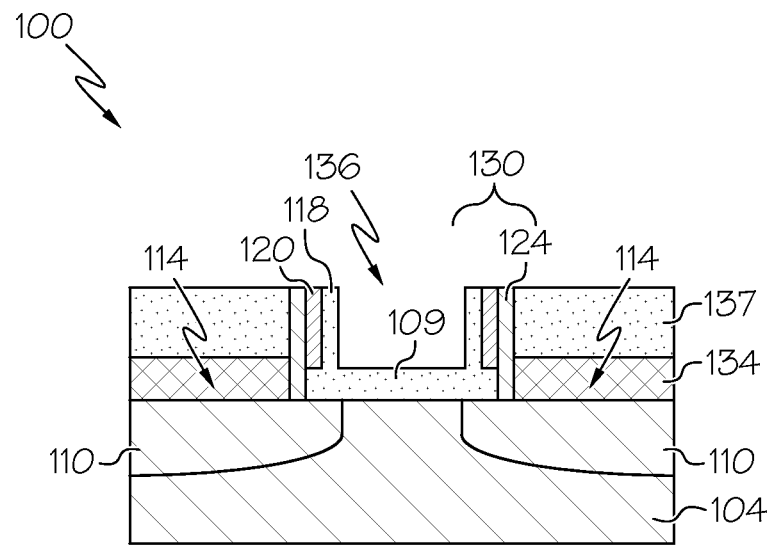
FIG. 1(I) shows a cross sectional view of the device following removal of the gate to form an opening according to illustrative embodiments.

Next, as demonstrated by device 100 in FIG. 1(I), capping layer 106 and gate 102 are removed between set of spacer layers 130 to form an opening 136 therein. In an exemplary embodiment, wherein gate 102 comprises polysilicon, an appropriate polysilicon etching technique is used. For example, gate 102 can be removed by performing a wet etch (e.g., ammonium hydroxide) selective to gate oxide 118 and dummy layer 209.

Figure 1J:
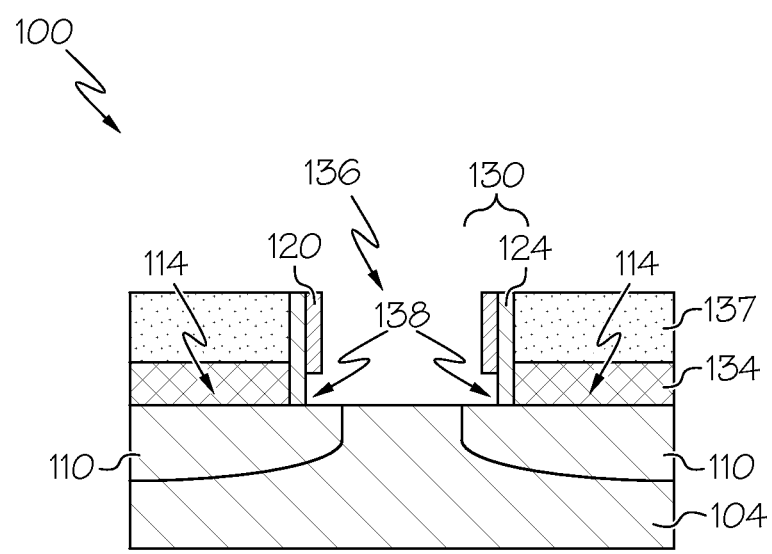
FIG. 1(J) shows a cross-sectional view of the device following removal of the dummy layer according to illustrative embodiments.
Figure 1K:
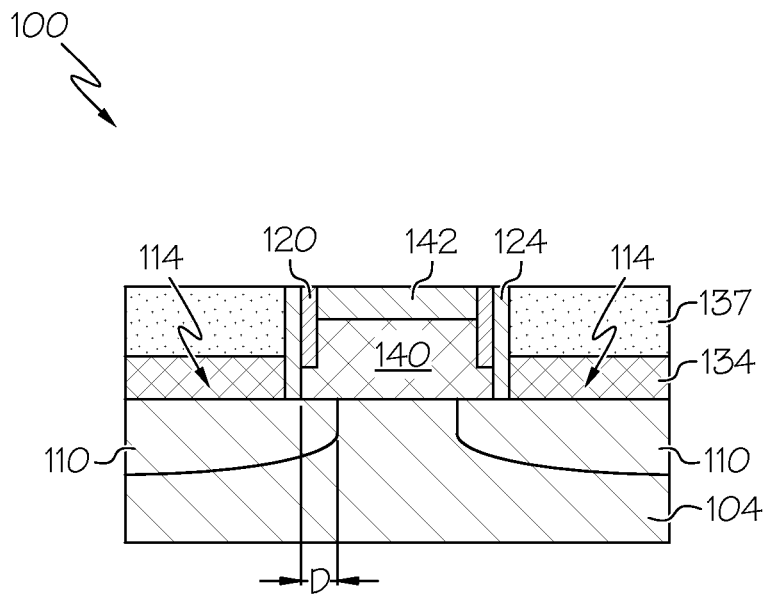
FIG. 1(K) shows a cross-sectional view of the device following formation of a replacement gate electrode within the opening according to illustrative embodiments.

Next, as demonstrated by device 100 in FIG. 1(J), gate oxide 118 is removed from within opening 136, exposing low-k spacer 120. As shown, an oxide strip process leaves SiBCN of low-k spacer layers 120 in place, along with a set of recesses 138 beneath low-k spacer layers 120. Recesses 138, along with opening 136, are subsequently filled with gate oxide and metal materials to form a replacement gate electrode 140, as shown in FIG. 1(K). Replacement gate electrode 140 may include multiple oxides and metals. In this step, the previously removed gate is replaced by a gate oxide having desirable electrical and interfacial properties, followed by a metal electrode having desirable electrical characteristics or, alternatively, replaced with polysilicon, which may be salicided to achieved desirable electrical characteristics. As shown, replacement gate electrode 140 extends over the junction extensions 110 by junction extension overlap linear distance '13', which is defined by the sacrificial spacer layer (i.e., gate oxide 118) of set of spacer layers 130 (FIG. 1(I)) that is removed from opening 136 prior to formation replacement gate electrode 140. A gate-capping layer 142 is then formed over metal material 140, and processing of device 100 continues, as conventionally known.

It will be appreciated that device 100 described herein and shown in FIGS. 1(A)-1(K) provides a specifically scalable scheme using multiple patterned spacer layers to provide junction overlap control. This approach makes use of a bilayer flow to achieve etch selectivity and hence scalability. Further, this selectivity allows the use of sensitive channel materials such as SiGe or III-V, which must be processed more carefully, since the lower layer may be left intact after RIE, then removed using gentle selective etching, as shown in FIGS. 1(D)-(E).

Figure 2A:
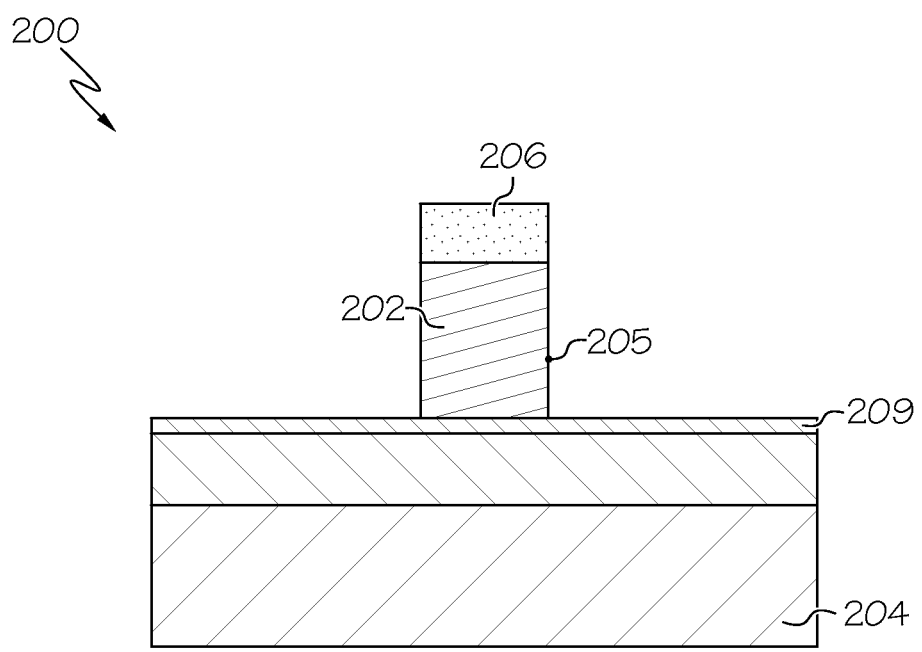
FIG. 2(A) shows a cross-sectional view of a semiconductor device following formation of a dummy layer adjacent a gate provided over a substrate according to illustrative embodiments.

Turning now to FIG. 2(A), another related approach for providing junction overlap control in a semiconductor device is shown. In this approach, a device 200 (e.g., a FinFET) is provided including a gate 202 (e.g., a gate electrode for a replacement metal gate) formed over a substrate 204, gate 202 having a set of sidewalls 205, and including oxide 208 formed thereon. Although not specifically shown, device 200 may also include a set of fins patterned from substrate 204, as conventionally known.

Figure 2B:
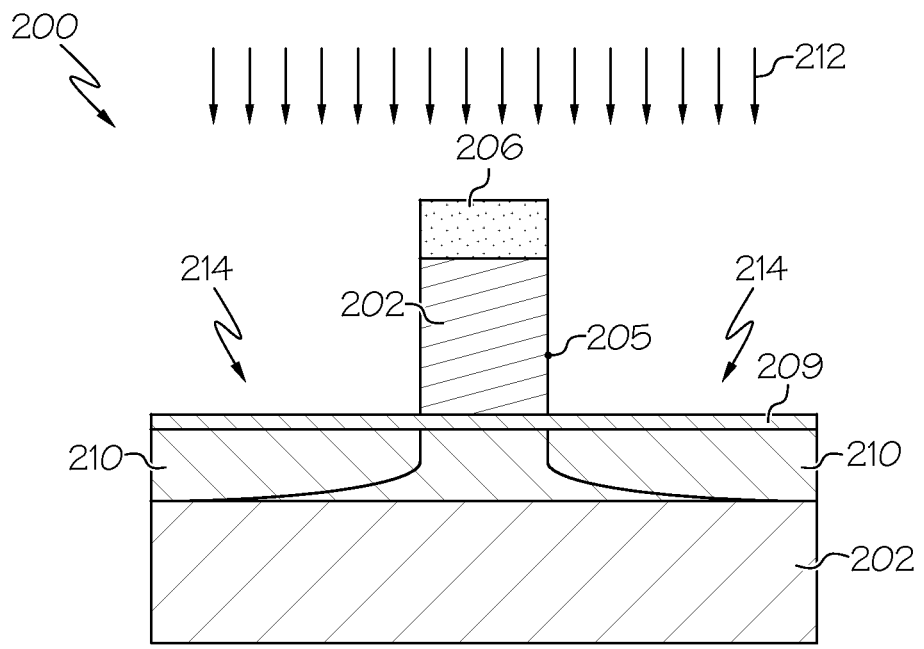
FIG. 2(B) shows a cross-sectional view of the device during an implantation and drive-in process through the dummy layer according to illustrative embodiments.
Figure 2C:
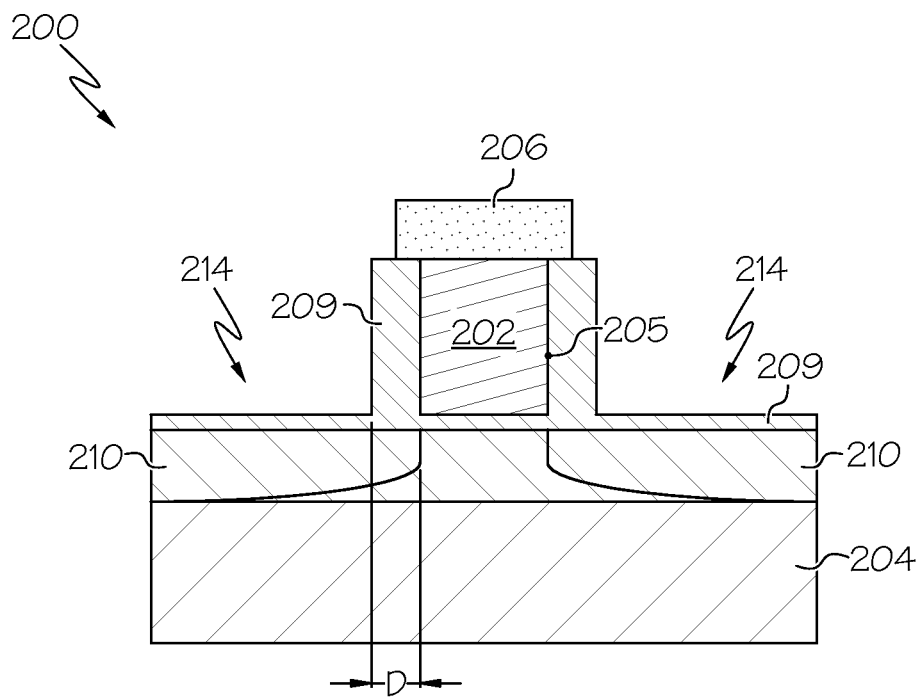
FIG. 2(C) shows a cross-sectional view of the device following oxidation of the gate to grow the dummy oxide on a set of sidewalls of the gate according to illustrative embodiments.

Device 200 is then implanted, as shown in FIG. 2(B), via a doping and drive-in process 212 through a dummy layer 209 to form a set of junction extensions 210 adjacent gate 202 in a channel region 214. In an exemplary embodiment, the polysilicon of gate 202 is oxidized to grow dummy layer 209 (e.g., a sacrificial oxide) along sidewalls 205 of gate 202, as shown in FIG. 2(C). In this case, the channel oxidation rate is less than a poly oxidation rate, resulting in the structure shown, wherein the thickness of the dummy layer 209 along gate 202 is greater than over channel region 214. Sacrificial dummy layer 209 defines a junction extension overlap distance/thickness 'D' over junction extensions 210.

Figure 2D:
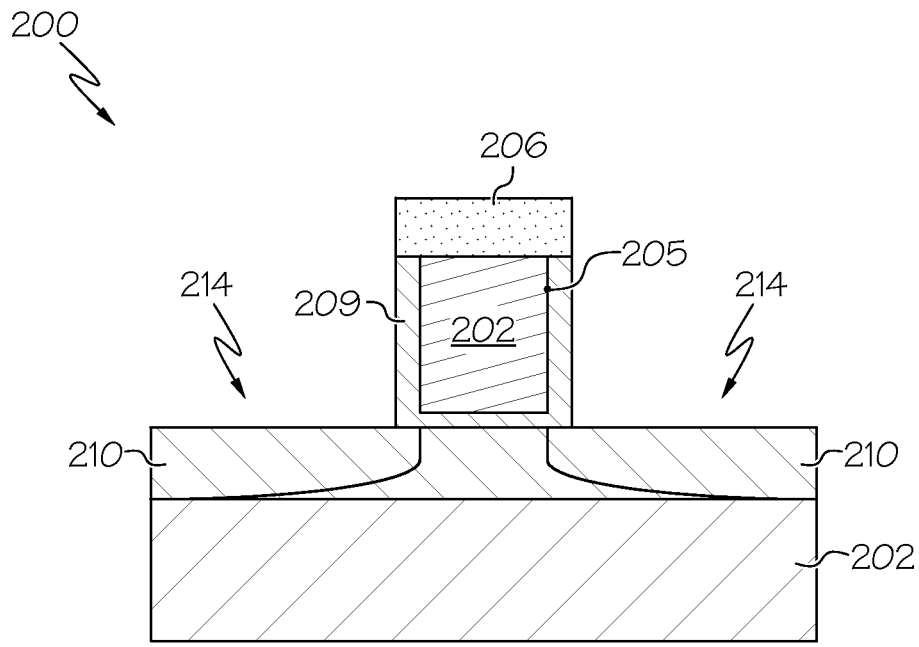
FIG. 2(D) shows a cross-sectional view of the device following partial removal of the dummy oxide over a channel region according to illustrative embodiments.
Figure 2E:
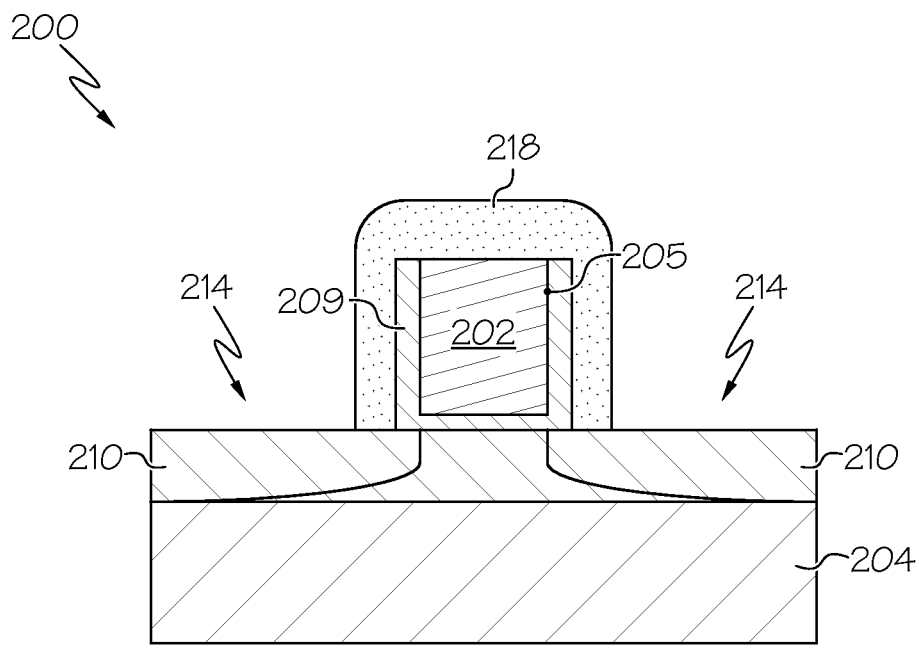
FIG. 2(E) shows a cross-sectional view of the device following formation of a gate spacer over the gate according to illustrative embodiments.

Next, as demonstrated by device 200 in FIG. 2(D), a COR, Siconi or wet etch process is performed to remove any dummy layer 209 from atop junction extensions 210 in channel region 214. Dummy oxide 209 along sidewalls 205 of gate 202 remains, however. A spacer 218 (e.g., silicon nitride or low-k spacer material such as SiBCN) is then formed over device 200, as shown in FIG. 2(E). Once formed, spacer 218 and sacrificial dummy layer 209 together make up a set of spacer layers 230 along sidewalls 205 of gate 202, wherein dummy layer 209 represents a sacrificial spacer layer.

Figure 2F:
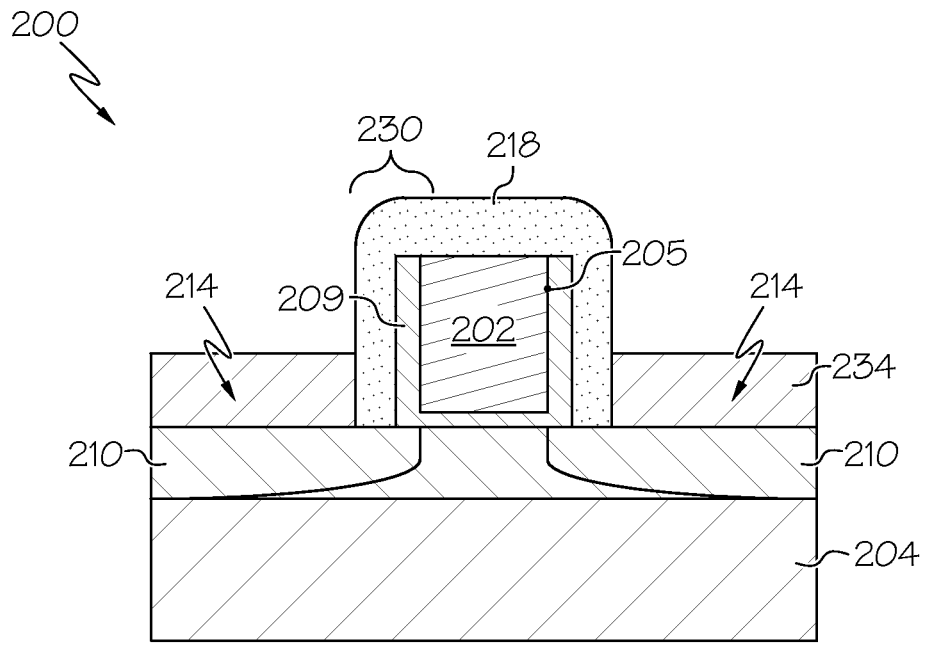
FIG. 2(F) shows a cross-sectional view of the device following formation of heavily-doped layer adjacent the gate according to illustrative embodiments.
Figure 2G:
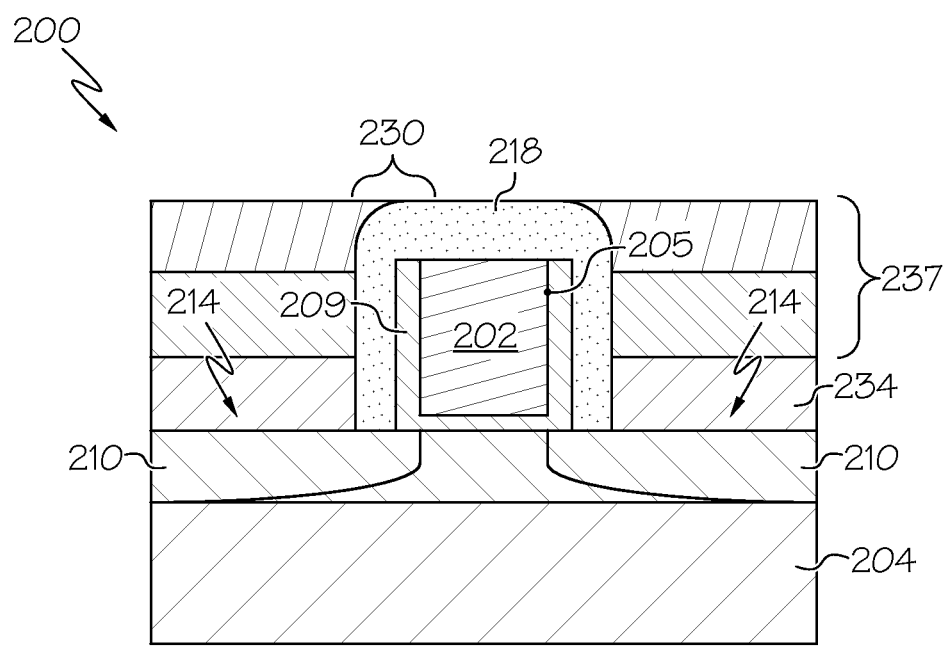
FIG. 2(G) shows a cross-sectional view of the device following formation of additional dielectric layers adjacent the gate according to illustrative embodiments.

FIG. 2(F) shows device 200 after a subsequent process step of forming highly-doped source/drain regions 234 adjacent gate 202. In embodiments, the plurality of highly-doped source/drain regions 234 may be epitaxial source/drain regions. In embodiments, the plurality of source/drain regions 234 may include, for example, silicon, and/or silicon germanium, or a III-V material. In other embodiments, not shown, these regions may be embedded into channel 214 by first partially or fully recessing the channel, then epitaxially growing the source/drain material. Dielectric capping of the source/drain material is then performed using CVD deposition and chemical mechanical planarization (CMP) processes to form interlayer dielectric layer(s) 237, preferably planarized to the capping layer over gate 202.

Figure 2H:
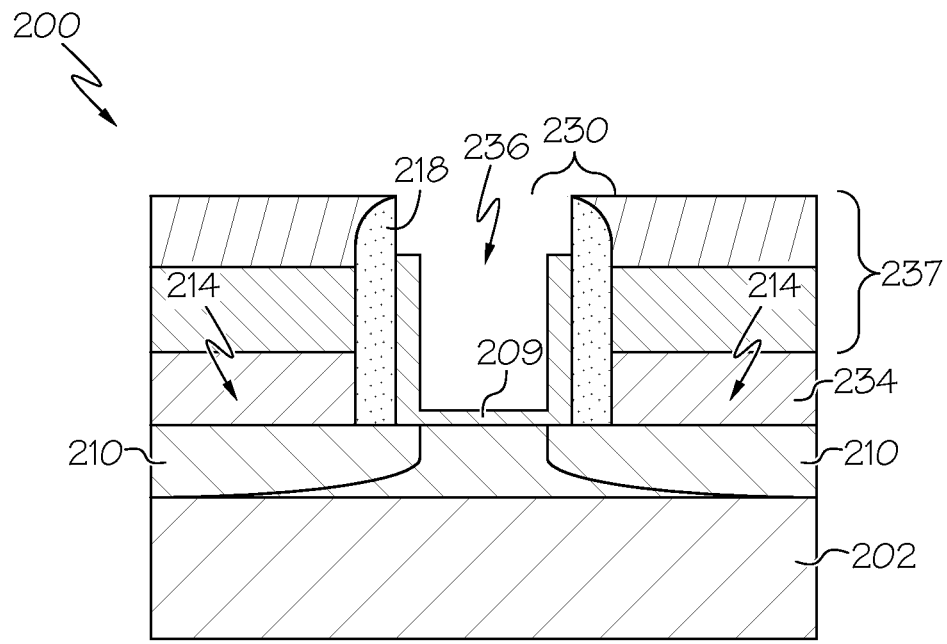
FIG. 2(H) shows a cross-sectional view of the device following removal of the gate to form an opening according to illustrative embodiments.

Next, as demonstrated by device 200 in FIG. 2(H), gate cap 218 and gate 202 are removed between set of spacer layers 230 to form an opening 236 therein. In an exemplary embodiment, wherein gate 202 comprises polysilicon, an appropriate polysilicon etching technique is used. For example, gate 202 can be removed by performing a wet etch (e.g., ammonium hydroxide) selective to dummy layer 209.

Figure 2I:
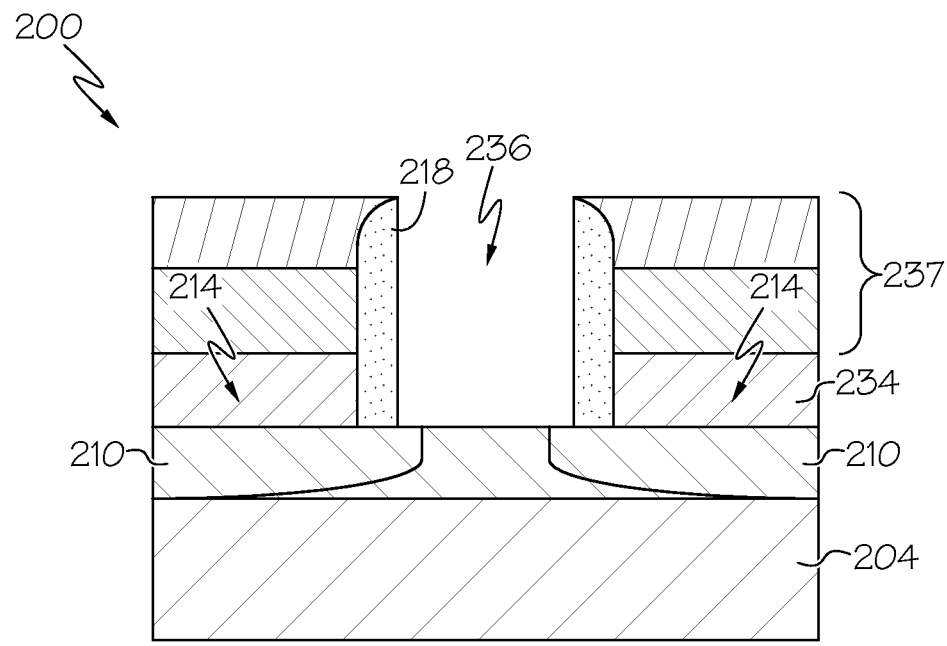
FIG. 2(I) shows a cross-sectional view of the device following removal of the dummy layer within the opening according to illustrative embodiments.
Figure 2J:
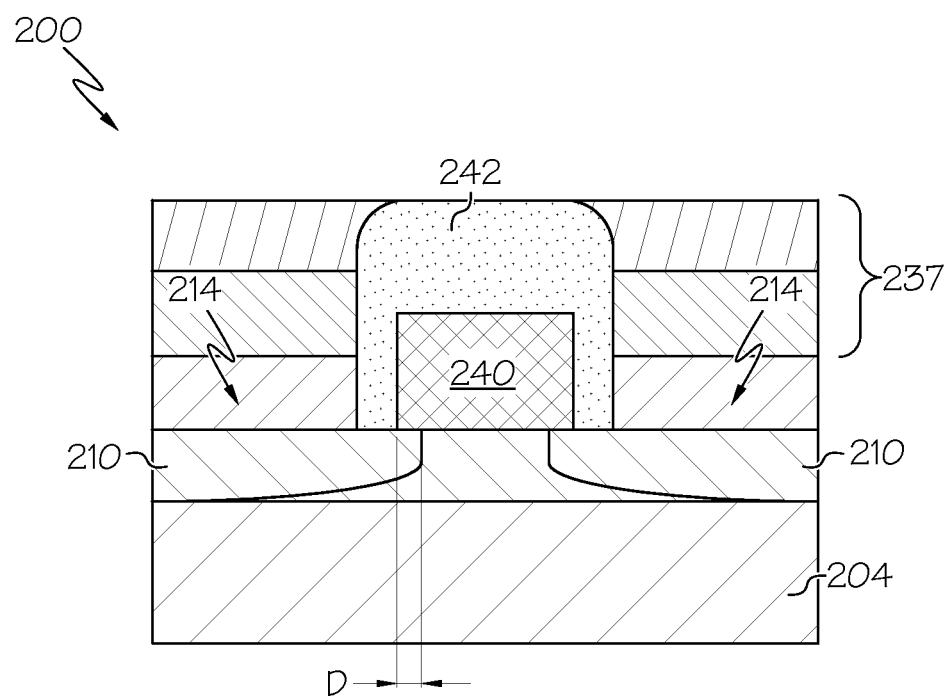
FIG. 2(J) shows a cross-sectional view of the device following formation of a replacement gate electrode within the opening according to illustrative embodiments.

Next, as demonstrated by device 20 in FIG. 2(I), sacrificial dummy layer 209 is removed from within opening 236, thus leaving spacer oxide 218. Opening 236 is subsequently filled with gate oxide and metal materials to form a replacement gate electrode 240, as shown in FIG. 2(J). Replacement gate electrode 240 may include multiple oxides and metals. In this step, the previously removed gate is replaced by a gate oxide having desirable electrical and interfacial properties, followed by a metal electrode having desirable electrical characteristics or, alternatively, replaced with polysilicon, which may be salicided to achieved desirable electrical characteristics. As shown, replacement gate electrode 240 extends over the junction extensions 210 by junction extension overlap linear distance 'D', which is defined by the sacrificial spacer layer (i.e., dummy layer 209) of set of spacer layers 230 (FIG. 2(H)) that is removed from opening 236 prior to formation replacement gate electrode 240. A gate-capping layer 242 is also formed over metal material 240, and processing of device 200 continues, as conventionally known.

It will be appreciated that device 200 described herein and shown in FIGS. 2(A)-2(J) provides formation of an inner sacrificial spacer layer using oxidation of the dummy poly gate. This approach allows the creation of extremely abrupt junctions whose surface position (i.e., overlap) is defined using the sacrificial spacer. This spacer is then removed prior to final gate deposition, allowing a fixed gate overlap defined by the spacer thickness and any species diffusion.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof, to provide the following processing steps: providing a gate over a substrate; forming a set of junction extensions adjacent the gate; forming a set of spacer layers along each of a set of sidewalls of the gate; removing the gate between the set of spacer layers to form an opening; removing, from within the opening, an exposed sacrificial spacer layer of the set of spacer layers, the exposed sacrificial spacer layer defining a junction extension overlap linear distance from the set of sidewalls of the gate; and forming a replacement gate electrode within the opening.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

As another example, a tool can be a computing device or other appliance on which software runs or in which hardware is implemented. The tool is capable of producing a semiconductor device including: a set of junction extensions adjacent a replacement gate; and a set of spacer layers formed along each of a set of sidewalls of the replacement gate, wherein the replacement gate includes a replacement gate electrode formed within an opening between the set of spacer layers, the replacement gate electrode extending over the set of junction extensions by a junction extension overlap distance defined by a sacrificial spacer layer of the set of spacer layers that is removed from the opening prior to formation of the replacement gate material It is apparent that there has been provided approaches for providing junction overlap control using a sacrificial spacer layer a semiconductor device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for providing junction overlap control in a semiconductor device, the method comprising:
   providing a gate over a substrate;
   forming a set of junction extensions adjacent the gate;
   forming a set of spacer layers along each of a set of sidewalls of the gate;
   removing the gate between the set of spacer layers to form an opening;
   removing, from within the opening, an exposed sacrificial spacer layer of the set of spacer layers, the exposed sacrificial spacer layer defining a junction extension overlap distance; and
   forming a replacement gate electrode within the opening and in direct physical contact with each junction extension of the set of junction extensions.

2. The method according to claim 1, the forming the set of junction extensions comprising: forming a dummy layer over the substrate; and
   doping the substrate through the dummy layer.

3. The method according to claim 2, the forming the set of spacer layers comprising:
   oxidizing the gate to grow the dummy layer on the set of sidewalls of the gate;
   removing the dummy layer from atop the set of junction extensions; and
   forming a spacer oxide over the gate.

4. The method according to claim 3, the removing the dummy layer comprising removing the dummy layer from within the opening.

5. The method according to claim 1, the forming the set of spacer layers comprising:
   forming a set of bilayer spacers along each of the set of sidewalls of the gate; and
   forming a set of conformal spacer layers adjacent the set of bilayer spacers.

6. The method according to claim 5, wherein the forming the set of bilayer spacers comprises:
   forming a spacer oxide over the gate and the set of junction extensions;
   forming a set of low-k spacer layers along each of the set of sidewalls of the gate; and
   removing the spacer oxide over the set of junction extensions.

7. The method according to claim 6, the removing the exposed sacrificial layer comprising removing the spacer oxide selective to the low-k spacer layer.

8. The method according to claim 6, the forming the replacement gate electrode within the opening includes depositing a metal material within the opening, wherein the metal material fills a set of recesses formed beneath the set of low-k spacer layers.

9. A method for providing junction overlap control in a fin field effect transistor (FinFET) device, the method comprising:
   providing a gate over a substrate;
   forming a set of junction extensions adjacent the gate;
   forming a set of spacer layers along each of a set of sidewalls of the gate;
   removing the gate between the set of spacer layers to form an opening;
   removing, from within the opening, an exposed sacrificial spacer layer of the set of spacer layers, the exposed sacrificial spacer layer defining a junction extension overlap linear distance from the set of sidewalls of the gate; and
   forming a replacement gate electrode within the opening and in direct physical contact with each junction extension of the set of junction extensions.

10. The method according to claim 9, the forming the set of junction extensions comprising: forming a dummy layer over the substrate; and
    doping the substrate through the dummy layer.

11. The method according to claim 10, the forming the set of spacer layers comprising:
    oxidizing the gate to grow the dummy layer on the set of sidewalls of the gate;
    removing the dummy layer from atop the set of junction extensions; and
    forming a spacer oxide over the gate.

12. The method according to claim 11, the removing the dummy layer comprising removing the dummy layer from within the opening.

13. The method according to claim 9, the forming the set of spacer layers comprising:
    forming a set of bilayer spacers along each of the set of sidewalls of the gate; and
    forming a set of conformal spacer layers adjacent the set of bilayer spacers.

14. The method according to claim 13, wherein the forming the set of bilayer spacers comprises:
    forming a spacer oxide over the gate and the set of junction extensions;
    forming a set of low-k spacer layers along each of the set of sidewalls of the gate; and
    removing the spacer oxide over the set of junction extensions.

15. The method according to claim 14, the removing the exposed sacrificial layer comprising removing the spacer oxide selective to the low-k spacer layer.

16. The method according to claim 14, the forming the replacement gate electrode within the opening including depositing a metal material within the opening, wherein the metal material fills a set of recesses formed beneath the set of low-k spacer layers.

17. A semiconductor device, comprising:
    a set of junction extensions adjacent a replacement gate, wherein the replacement gate is in direct physical contact with each junction extension of the set of junction extensions; and
    a set of spacer layers formed along each of a set of sidewalls of the replacement gate, wherein the replacement gate includes a replacement gate electrode formed within an opening between the set of spacer layers, the replacement gate electrode extending over the set of junction extensions by a junction extension overlap distance defined by a sacrificial spacer layer of the set of spacer layers that is removed from the opening prior to formation of the replacement gate electrode.

18. The semiconductor device of claim 17, further comprising a capping layer formed atop the replacement gate electrode.

19. The semiconductor device of claim 17, the set of spacer layers comprising a conformal spacer layer adjacent the sacrificial spacer layer, the sacrificial spacer layer comprising a low-k material.

20. The semiconductor device of claim 17, the replacement gate electrode extending into a set of recesses formed beneath the set of spacer layers.

* * * * *